US009099644B2

(12) United States Patent
Liu et al.

(10) Patent No.: US 9,099,644 B2
(45) Date of Patent: Aug. 4, 2015

(54) PHASE CHANGE MEMORY CELL

(75) Inventors: Peng Liu, Beijing (CN); Qun-Qing Li, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 505 days.

(21) Appl. No.: 13/332,480

(22) Filed: Dec. 21, 2011

(65) Prior Publication Data

US 2012/0326109 A1 Dec. 27, 2012

(30) Foreign Application Priority Data

Jun. 24, 2011 (CN) .......................... 2011 1 0172963

(51) Int. Cl.
*H01L 29/02* (2006.01)
*H01L 45/00* (2006.01)
*H01L 27/24* (2006.01)

(52) U.S. Cl.
CPC ........ *H01L 45/1226* (2013.01); *H01L 27/2463* (2013.01); *H01L 45/06* (2013.01); *H01L 45/1206* (2013.01); *H01L 45/1286* (2013.01); *H01L 45/144* (2013.01)

(58) Field of Classification Search
CPC ... H01L 45/06; H01L 45/1206; H01L 45/126; H01L 45/144; H01L 45/1226; H01L 45/1286
See application file for complete search history.

(56) References Cited

U.S. PATENT DOCUMENTS

| 7,749,801 | B2 | 7/2010 | Choi et al. | |
|---|---|---|---|---|
| 2007/0051935 | A1 | 3/2007 | Lee et al. | |
| 2008/0007997 | A1 | 1/2008 | Sousa | |
| 2008/0248235 | A1* | 10/2008 | Feng et al. | 428/113 |
| 2008/0251778 | A1* | 10/2008 | Chen et al. | 257/4 |
| 2009/0197038 | A1* | 8/2009 | Wang et al. | 428/114 |
| 2009/0267000 | A1 | 10/2009 | Chen et al. | |
| 2009/0321718 | A1 | 12/2009 | Liu et al. | |
| 2010/0147828 | A1* | 6/2010 | Wang et al. | 219/546 |
| 2010/0327247 | A1* | 12/2010 | Ward et al. | 257/2 |

FOREIGN PATENT DOCUMENTS

| CN | 1776930 A | 5/2006 |
|---|---|---|
| CN | 1996634 A | 7/2007 |
| CN | 101239712 A | 8/2008 |
| CN | 101497436 | 8/2009 |
| CN | 101521177 A | 9/2009 |
| JP | 2007-157776 | 6/2007 |
| JP | 2008-526008 | 7/2008 |
| JP | 2009-278108 | 11/2009 |
| TW | 200946471 | 11/2009 |

* cited by examiner

*Primary Examiner* — Whitney T Moore
*Assistant Examiner* — Joseph Galvin, III
(74) *Attorney, Agent, or Firm* — Novak Druce Connolly Bove + Quigg LLP

(57) ABSTRACT

A phase change memory cell includes a first circuit and a second circuit. The first circuit comprises a first electrode, a carbon nanotube layer and a second electrode electrically connected in series. The first circuit is adapted to write data into the phase change memory cell or reset the phase change memory cell. The second circuit comprises a third electrode, a phase change layer and a fourth electrode electrically connected in series, at least part of the phase change layer is overlapped with the carbon nanotube layer. The second circuit is adapted to read data from the phase change memory cell or reset the phase change memory cell.

20 Claims, 12 Drawing Sheets

PHASE CHANGE MEMORY CELL

CROSS-REFERENCE TO RELATED APPLICATIONS

This application claims all benefits accruing under 35 U.S.C. §119 from China Patent Application 201110172963.6, filed on Jun. 24, 2011 in the China Intellectual Property Office, disclosure of which is incorporated herein by reference. This application is related to applications entitled, "A METHOD FOR MAKING PHASE CHAGE MEMORY", filed on Dec. 21, 2011, Ser. No. 13/332,486.

BACKGROUND

1. Technical Field

The present disclosure relates to a phase change memory cell and a phase change memory.

2. Description of Related Art

Generally, semiconductor memory devices are categorized as random access memories (RAMs) or read-only memories (ROMs). ROMs are nonvolatile memory devices such as PROMs (programmable ROMs), EPROMs (erasable PROMs), EEPROMs (electrical EPROMs), and flash memory devices, which retain their stored data even when their power supplies are interrupted. New types of RAMs containing nonvolatile memory devices have recently been introduced. Examples includes ferroelectric RAMs (FRAMs) employing ferroelectric capacitors, magnetic RAMs (MRAMs) employing tunneling magneto-resistive (TMR) films, and phase change memories (PCM) using chalcogenide alloys. Among these, the phase change memory cannot only be widely used in civilian areas of microelectronics such as mobile phones, digital cameras, MP3 players, and mobile memory, but also has important applications in aerospace, missile systems, and military field in the future. The phase change memory devices are relatively easy to fabricate, and thus phase change memory devices may provide the best opportunities in the actual implementation of high-capacity, low cost nonvolatile RAMs.

In traditional phase change memory cell, a heating element is used to heat the phase change material. During the dynamic storage, the heating element heats the phase change material to produce phase transition. However, one problem is that the heating element is made of metal or semiconductor, so it is prone to damage or oxidation during the cycle of heating process. Thus the lifespan of phase change memory cell will be affected. Furthermore, the heating element is formed by sputtering or vapor deposition, this process is complex and the production cost is relatively high.

What is needed, therefore, is to provide a phase change memory cell and a phase change memory that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
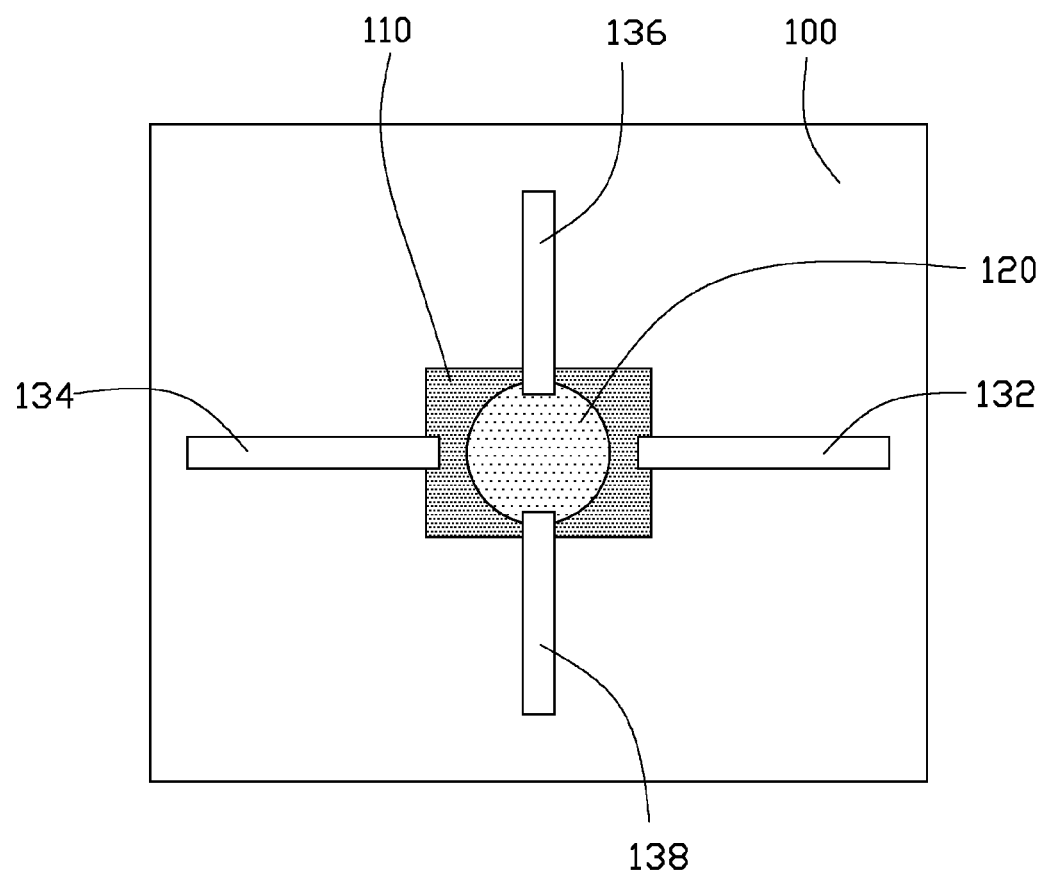
FIG. 1 shows a schematic top view of one embodiment of a phase change memory cell.

Referring to FIG. 1, a phase change memory cell 10 includes a substrate 100, a carbon nanotube layer 110, a phase change layer 120, a first electrode 132, a second electrode 134, a third electrode 136 and a fourth electrode 138. The substrate 100 is used to support the carbon nanotube layer 110, the phase change layer 120, the first electrode 132, the second electrode 134, the third electrode 136 and the fourth electrode 138. The carbon nanotube layer 110 and the phase change layer 120 are stacked together.

The phase change memory cell 10 includes a write circuit and a read circuit (not shown). The write circuit includes the first electrode 132, the carbon nanotube layer 110, and the second electrode 134 electrically connected in series. The write circuit is used to write data into the phase change memory cell 10. The read circuit includes the third electrode 136, the phase change layer 120, and the fourth electrode 138 electrically connected in series. The read circuit is used to read data from the phase change memory cell 10. Both the write circuit and the read circuit can be used to reset the phase change memory cell 10. At least part of the carbon nanotube layer 110 and the phase change layer 120 overlap each other.

The substrate 100 is an insulating substrate, and the material of the substrate 100 can be porcelain, glass, resin, quartz, or any combination thereof. The substrate 100 has a character of high temperature endurance, thus the shape of the substrate 100 can be retained during the working process of the phase change memory 10. The size and the thickness of the substrate 100 can be selected according to the working temperature of the phase change memory cell 10. In one embodiment, the substrate 100 is flexible, and the material of the substrate 100 can be selected form polyimide, phenolic resin, polyester resin, and polyamide resin. In one embodiment, the material of the substrate 100 is polyimide with a thickness of about 20 μm. The shape of the substrate 100 can be retained under a temperature of 400° C.

The size and shape of the carbon nanotube layer 110 can be selected according to need, for example, the size and the shape can be selected according to the size and shape of the phase change memory cell 10 respectively. The shape of the carbon nanotube layer 110 can be triangular, square, rectangular, round, oval or other geometric shapes. In one embodiment, the shape of the carbon nanotube layer 110 is rectangular. The length of the rectangle is in a range from about 50 nm to about 900 μm, and the width of the rectangle is in a range from about 20 nm to about 600 μm. In one embodiment, the length is 70 μm, and the width is 50 μm. The thickness of the carbon nanotube layer 110 is in a range from about 0.5 nanometer (nm) to about 100 micrometers (μm), such as 5 nm, 20 nm, 5 μm, 10 μm, 20 μm.

The carbon nanotube layer 110 includes a plurality of carbon nanotubes. The extending direction of the carbon nanotubes is parallel with the surface of the carbon nanotube layer 110. When the carbon nanotube layer 110 is located on the surface of the substrate 100, the extending direction of the carbon nanotubes is parallel with the surface of the substrate. The carbon nanotube layer 110 can be a continuous film or a wire. The carbon nanotubes can be orderly or disorderly aligned. If the carbon nanotubes are disorderly aligned, the carbon nanotubes can be entangled with each other. If the carbon nanotubes are orderly aligned, the carbon nanotubes can be oriented along one or more preferred orientations. The preferred orientation means that a large majority of the carbon nanotubes in the carbon nanotube layer 110 are arranged substantially along the same direction.

Figure 2:
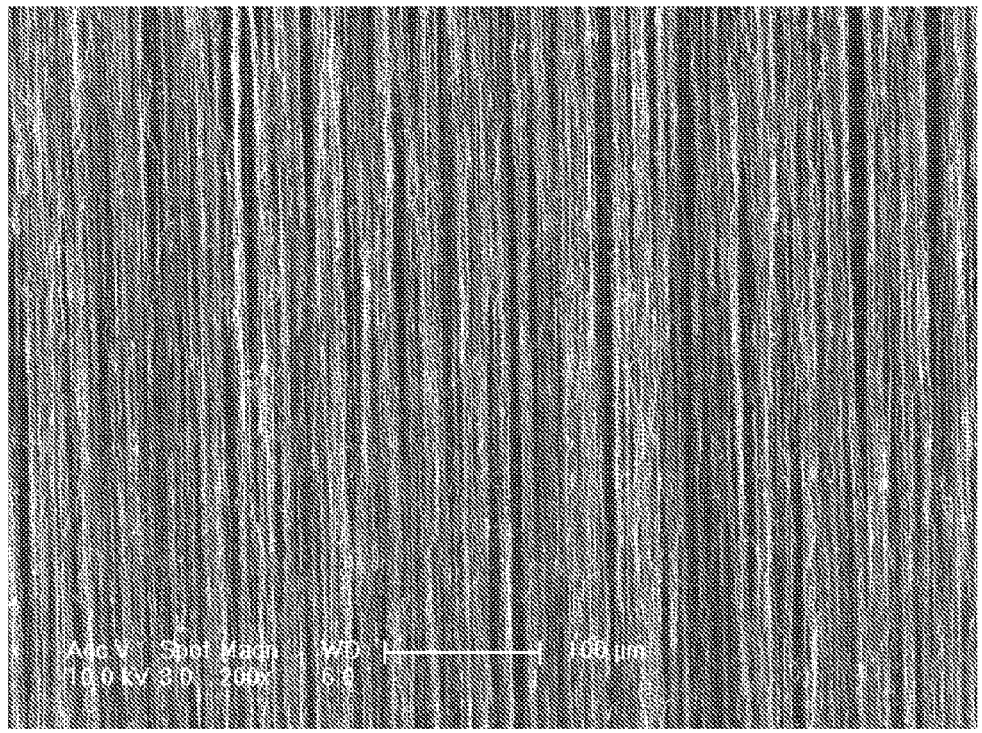
FIG. 2 shows a Scanning Electron Microscope (SEM) image of carbon nanotube film.

Referring to FIG. 2, in one embodiment, the carbon nanotube layer 110 includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Each drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. Some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nm to about 100 μm. Examples of a carbon nanotube film are taught by U.S. Pat. No. 7,045,108 to Jiang et al., and WO 2007015710 to Zhang et al.

The carbon nanotube layer 110 can include at least two stacked drawn carbon nanotube films. In other embodiments, the carbon nanotube layer 110 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes is 0 degrees, the two carbon nanotube films can be defined as oriented with the same preferred direction. When the angle between the aligned direction of the carbon nanotubes is greater than 0 degrees and smaller than 90 degrees or equal to 90 degrees, the two carbon nanotube films can be defined as entangled with each other. Stacking the carbon nanotube films will also add to the structural integrity of the carbon nanotube layer 110.

In another embodiment, the carbon nanotube layer 110 can include at least a pressed carbon nanotube film. The pressed carbon nanotube film can be a free-standing carbon nanotube film. The carbon nanotubes in the pressed carbon nanotube film are arranged along a same direction or arranged along different directions. The carbon nanotubes in the pressed carbon nanotube film can rest upon each other. Adjacent carbon nanotubes are attracted to each other and combined by van der Waals attractive force. An angle between a primary alignment direction of the carbon nanotubes and a surface of the pressed carbon nanotube film is 0 degrees to approximately 15 degrees. The greater the pressure applied, the smaller the angle formed. When the carbon nanotubes in the pressed carbon nanotube film are arranged along different directions, the carbon nanotubes in the pressed carbon nanotube film have the same properties, such as conductivity, intensity, etc., along the direction parallel to the surface of the pressed carbon nanotube film/

In another embodiment, the carbon nanotube layer 110 includes a flocculated carbon nanotube film. The flocculated carbon nanotube film can include a plurality of long, curved, disordered carbon nanotubes entangled with each other. The carbon nanotubes can be substantially uniformly dispersed in the carbon nanotube film. Adjacent carbon nanotubes are acted upon by van der Waals attractive force to form an entangled structure with micropores defined therein. It is understood that the flocculated carbon nanotube film is very porous. The length of the carbon nanotubes can be greater than 10 μm. Furthermore, due to the carbon nanotubes in the carbon nanotube layer 110 being entangled with each other, the carbon nanotube layer 110 employing the flocculated carbon nanotube film has excellent durability, and can be fashioned into desired shapes with a low risk to the integrity of the carbon nanotube layer 110. The flocculated carbon nanotube film, in some embodiments, is free standing due to the carbon nanotubes being entangled and adhered together by van der Waals attractive force therebetween.

The phase change layer 120 can be partly overlapped with the carbon nanotube layer 110. The surface of the phase change layer 120 is parallel with the surface of the carbon nanotube layer 110. Additionally, the surface of the phase change layer 120 is parallel with the extending direction of the carbon nanotubes. In one embodiment, the phase change layer 120 is stacked on the carbon nanotube layer 110. Furthermore, a conductive layer (not shown) can be located between the phase change layer 120 and the carbon nanotube layer 110 to transfer the heat produced by the carbon nanotube layer 110 to the phase change layer 120. The material of the conductive layer can be selected according to need such as the Au, Ag, Cu or other conductive materials. The phase change layer 120 and the carbon nanotube layer 110 can also be spaced in a certain interval. The distance of the interval can be arbitrary and the heat produced by the carbon nanotube layer 110 can transfer the phase of the phase change layer 120.

The thickness of the phase change layer 120 ranges from about 10 nm to about 200 nm. The shape of the phase change layer 120 can be triangular, square, rectangular, round, oval or other geometric shapes. The phase change layer 120 is located within the coverage area of the carbon nanotube layer 110. It means that the area of the phase change layer 120 is smaller than that of the carbon nanotube layer 110, and the entire phase change layer 120 is located within the surface of carbon nanotube layer 110. In one embodiment, the shape of the phase change layer 120 is round with a diameter in a range from about 20 nm to about 250 μm.

The material of the phase change layer 120 can be germanium-antimony-tellurium (Ge—Sb—Te, also referred as "GST"), germanium-tellurium, silicon-antimony-tellurium, silicon-tellurium, or chalcogenide alloys. The phase change layer 120 functions as a variable resistor (i.e., resistance being variable with heat). The phase change material is conditioned in one of two stable states, i.e., a crystalline state or an amorphous state. The phase change material can change phase between the crystalline state and the amorphous state, based on the heat produced by the carbon nanotube layer 110. In one embodiment, the material of the phase change layer 120 is GST, and the original state of the material is amorphous state with a relatively high resistance. The amorphous state will be transferred into crystalline state with a relatively low resistance over a crystallization temperature (Tc) in a range from about 200° C. to about 300° C., and the crystalline state will be transferred into amorphous state in a melting temperature (Tm) in a range from about 400° C. to about 500° C. The melting temperature is also the reset temperature of the phase change materials.

The terms "crystalline" and "amorphous" are relative terms in the context of phase change materials. That is, when a phase change memory cell 10 is said to be in its crystalline state, one skilled in the art will understand that the phase change material of the cell has a more well-ordered crystalline structure when compared to its amorphous state. A phase change memory cell 10 in its crystalline state need not be fully crystalline, and a phase change memory cell 10 in its amorphous state need not be fully amorphous. The resistance of the phase change materials in its crystalline state is smaller than that in its amorphous state.

The material of the first electrode 132 and the second electrode 134 can be made of conductive material such as conductive pastes, metal or ITO. The thickness of the first electrode 132 and the second electrode 134 can range from about 10 nm to about 100 μm respectively. In one embodiment, the thickness of the first electrode 132 and the second electrode 134 ranges from about 20 nm to about 50 nm respectively. The material of the first electrode 132 and the second electrode 134 is made of conductive pastes, which includes powdered metal, powdered glass with a low fusion point, and binder. The powdered metal is powdered silver. The binder is terpineol or ethyl cellulose. A weight percentage of the powdered metal is in a range from about 50% to about 90%. A weight percentage of the powdered glass with the low fusion point is in a range from about 2% to about 10%. A weight percentage of the binder is in a range from about 8% to about 40%. The first electrode 132 and the second electrode 134 are made by printing the conductive pastes onto part surface of the carbon nanotube layer 110.

The shape, size and the position of the first electrode 132 and the second electrode 134 are arbitrary. While applying a voltage between the first electrode 132 and the second electrode 134, the carbon nanotube layer 110 can produce heat to heat the phase change layer 120 to a temperature higher than the crystallization temperature (Tc) or melting temperature of the phase change temperature (Tm). In one embodiment, the first electrode 132 and the second electrode 134 are located on two opposite side of the carbon nanotube layer 110. The first electrode 132 is electrically connected with a first side of the carbon nanotube layer 110. The second electrode 134 is electrically connected with a second side of the carbon nanotube layer 110. Thus the first electrode 132 and the second electrode 134 are electrically connected with the entire carbon nanotube layer 110 respectively. Furthermore, the first electrode 132 can be in contact with each carbon nanotube on the first side of the carbon nanotube layer 110, the second electrode 134 can be in contact with each carbon nanotube on the second side of the carbon nanotube layer. Thus the current flowing in the carbon nanotube layer 110 is uniformly dispersed, and the heat efficiency will be improved.

The third electrode 136 and the fourth electrode 138 are electrically connected with the phase change layer 120. In one embodiment, the third electrode 136 and the fourth electrode 138 partly cover the surface of the phase change layer 120. The phase change layer 120 can be located between the carbon nanotube layer 110 and both of the third electrode 136 and the fourth electrode 138. By applying a voltage on the third electrode 136 and the fourth electrode 138, a current will be introduced into the phase change layer 120. In one embodiment, the fourth electrode 138 can be omitted. It means that a voltage can be either applied between the third electrode 136 and the first electrode 132, or the third electrode 136 and the second electrode 134 in order to introduce a current into the phase change layer 120. Thus the third electrode 136, the phase change layer 120 and the first electrode 132 (or the second electrode 134) are electrically connected in series.

The shape and size of the third electrode 136 and the fourth electrode 138 are arbitrary and can be selected according to need. The material of the third electrode 136 and the fourth electrode 138 are the same as the first electrode 132. In one embodiment, the material of the third electrode 136 and the fourth electrode 138 are conductive pastes.

The working process of the phase change memory cell 10 includes three stages: writing data, reading data and resetting data. The original state of the phase change layer 120 is amorphous state with high resistance and presents data "0". The amorphous state is usually referred to as a reset state. The crystalline state with low resistance presents data "1".

During the process of writing data, a voltage is applied between the first electrode 132 and the second electrode 134, the carbon nanotube layer 110 will produce heat to heat the phase change layer 120. While the temperature of the phase change material (GST) is heated to be higher than the Tc, the phase change material will turn to crystalline state with low resistance. Thus, the process of writing data is completed. Furthermore, when the voltage is removed, the phase change material is settled in the crystalline state when it is slowly quenched after being heated within a temperature window that higher than the Tc and low than the Tm during a time.

During the process of reading data, a relatively small voltage is applied between the third electrode 136 and the fourth electrode 138. The current flowing in the phase change layer 120 is so small that it cannot cause the phase transition. By measuring the feedback current, the resistance of the phase change layer 120 can be obtained. The data can be read out by comparing the obtained resistance with the original resistance of the phase change layer 120. If the obtained resistance is smaller than the original resistance of the phase change layer 120, a data "1" is obtained. If the obtained resistance is substantially equal to the original resistance, a data "0" is obtained.

During the process of resetting data, the phase change layer 120 is rapidly quenched after being heated over its melting point by supplied current. The state of the phase change material will be transferred into the amorphous state. The amorphous state is usually referred as a reset state, storing data "0". Thus the data of the phase change memory cell 10 is reset. The resistance in the memory cell is relatively high in the amorphous state, and relatively low in the crystalline state.

Figure 3:
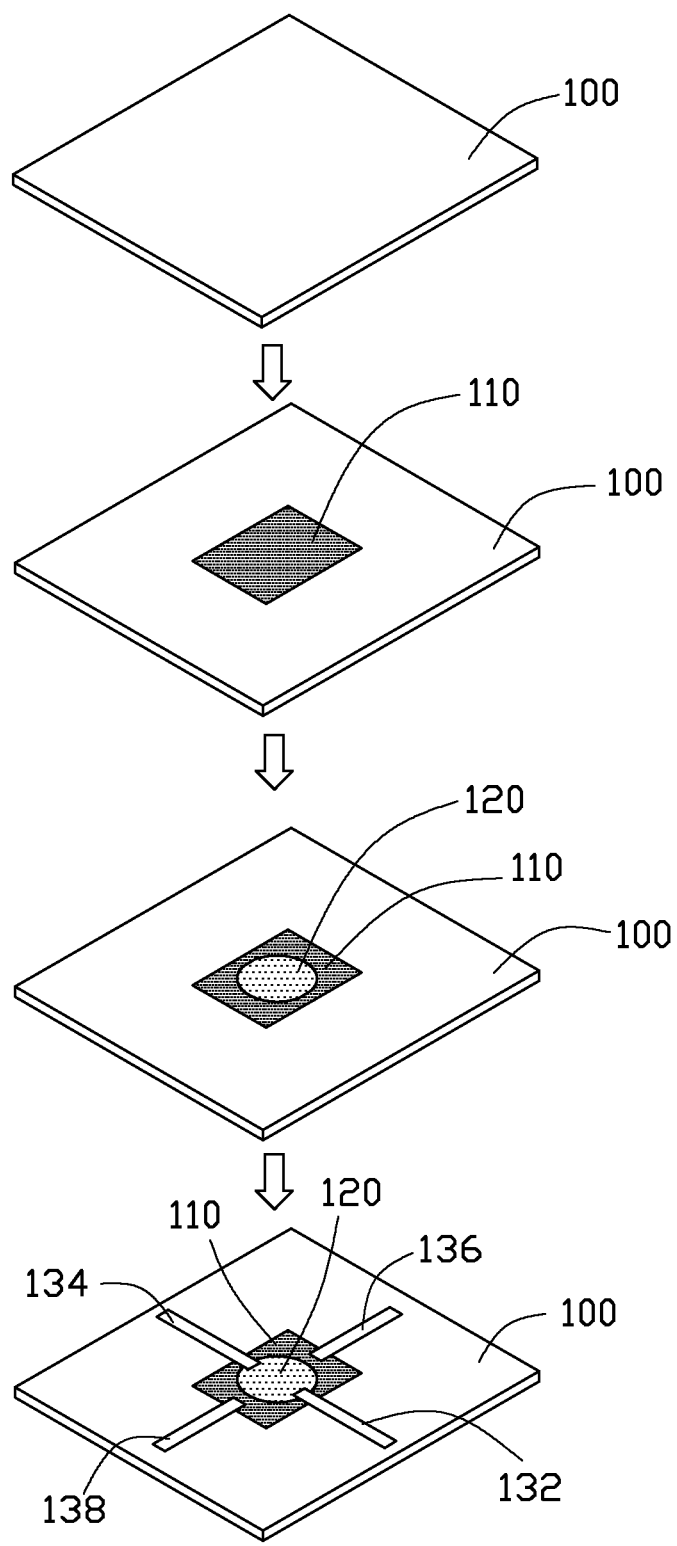
FIG. 3 is a flowchart of one embodiment of a method for making a phase change memory cell.

Referring to FIG. 3, a method for making a phase change memory cell 10 includes following steps:

(S11) providing a substrate 100;

(S12) stacking a carbon nanotube layer 110 and a phase change layer 120 on a surface of the substrate 100;

(S13) applying a first electrode 132 and a second electrode 134 in an interval on the carbon nanotube layer 110;

(S14) locating a third electrode 136 and a fourth electrode 138 in an interval on the phase change layer 120.

In step (S12), the carbon nanotube layer 110 includes a plurality of carbon nanotubes extending substantially parallel with the surface of the carbon nanotube layer 110. The extending direction of the carbon nanotubes is substantially parallel with the surface of the substrate 100. The carbon nanotube layer 110 is a free-standing structure, and it can be directly disposed on the substrate 100. The phase change layer 120 is located on the surface of the carbon nanotube layer 110 which away from the substrate 100. The phase change layer 120 can be disposed via a method such as screen printing, ion beam deposition, electron beam deposition, chemical vapor deposition or sputtering. In one embodiment, the phase change layer 120 is formed on the substrate 100 via sputtering.

In step (S13), the first electrode 132, the second electrode 134, the third electrode 136 and the fourth electrode 138 can be formed by a method such as screen printing, ion beam deposition, electron beam deposition, chemical vapor deposition or coating. In one embodiment, the first electrode 132, the second electrode 134, the third electrode 136 and the fourth electrode 138 are formed by screening printing respectively. The first electrode 132 and the second electrode 134 are located on the two opposite sides of the carbon nanotube layer 110 in a certain interval. The third electrode 136 and the fourth electrode 138 are located on the phase change layer 120 in a certain interval. The phase change layer 120 is located between the carbon nanotube layer 110 and both of the third electrode 136 and the fourth electrode 138.

In the method for making the phase change memory cell 10, because the carbon nanotube layer 110 is a free-standing structure, the carbon nanotube layer 110 can be directly located on the substrate 100 and function as the heating element. The manufacturing process is simple. The carbon nanotube layer 110 is stacked with the phase change layer 120, thus the mechanical strength will be enhanced and the heating efficiency will be improved.

Figure 4:
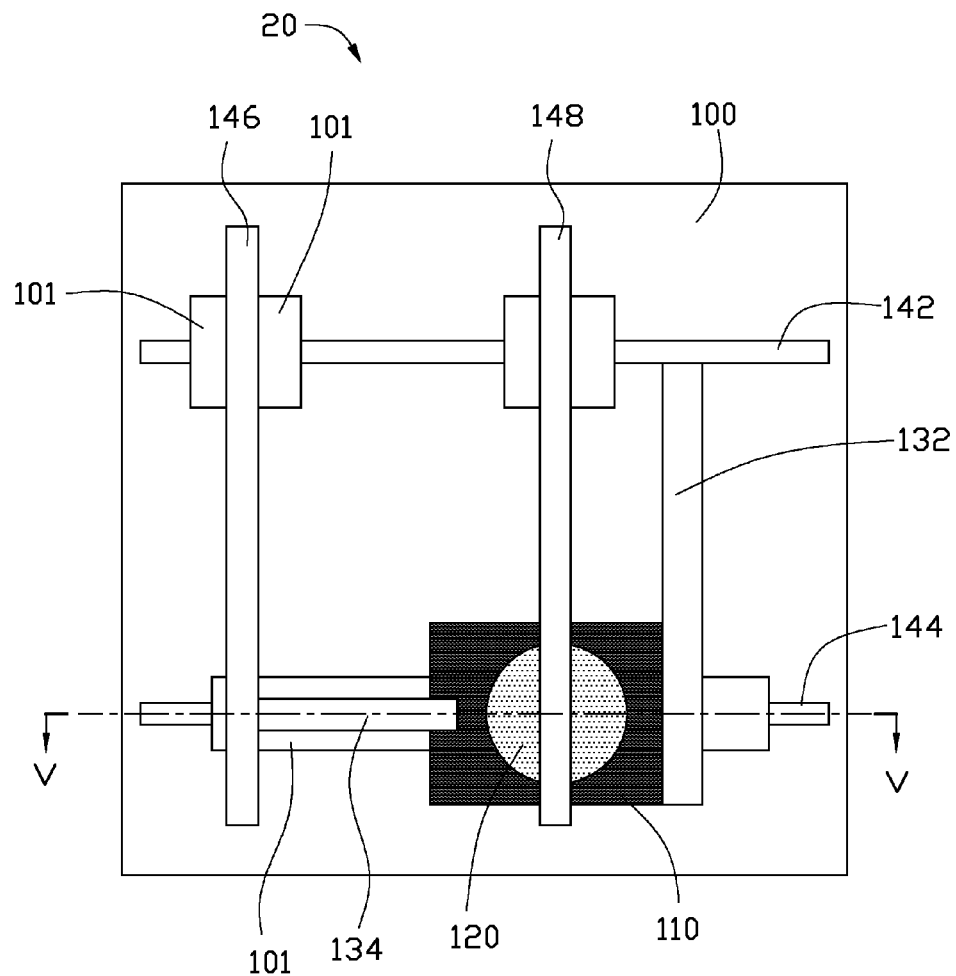
FIG. 4 shows a schematic top view of one embodiment of a phase change memory cell.
Figure 5:
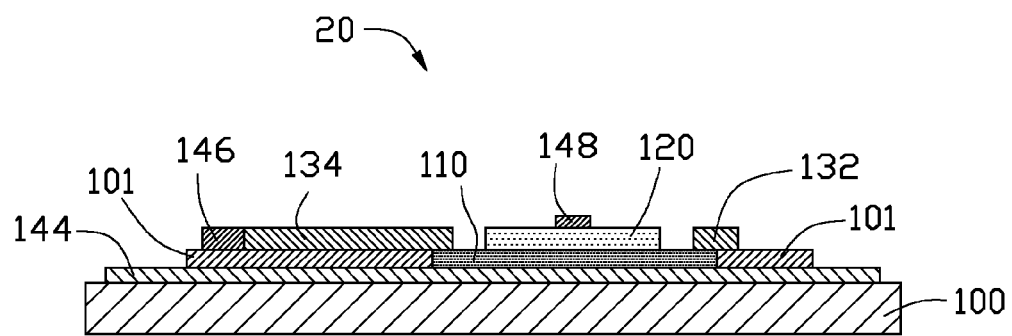
FIG. 5 shows a cross-sectional view along a line of V-V of FIG. 4.

Referring to FIG. 4 and FIG. 5, a phase change memory cell 20 includes a substrate 100, a carbon nanotube layer 110, a phase change layer 120, a first electrode 132, a second electrode 134, a first row electrode lead 142, a second row electrode lead 144, a first column electrode lead 146 and a second column electrode lead 148. The phase change memory cell 20 includes a first circuit and a second circuit. The first circuit includes the first row electrode lead 142, the first electrode 132, the carbon nanotube layer 110 and the first column electrode lead 146 electrically connected in series. The first circuit is a data writing circuit used to write data in the working process of the phase change memory cell 20. The second circuit includes the second row electrode lead 144, the carbon nanotube layer 110, the phase change layer 120 and the second column electrode lead 148 electrically connected in series. The carbon nanotube layer 110 is at least partly overlapped with the phase change layer 120. The second circuit is a data writing circuit used to read data. Both the first circuit and the second circuit can be used to reset the phase change memory cell 20.

The first row electrode lead 142 and the second row electrode lead 144 are parallel with each other and located on the substrate 100 in an interval. The first column electrode lead 146 and the second column electrode lead 148 are parallel with each other and located on the substrate 100 in a certain interval. The first row electrode lead 142 intersects with and is insulated from the first column electrode lead 146 and the second column electrode lead 148. The second row electrode lead 144 intersects with and is insulated from the first column electrode lead 146 and the second column electrode lead 148. The phase change layer 120 and the carbon nanotube layer 110 are stacked at the intersection of the second row electrode lead 144 and the second column electrode lead 148. The first row electrode lead 142, the first electrode 132, the carbon nanotube layer 110 and the first column electrode lead 146 are electrically connected in series to form the first circuit. The first circuit is a heating circuit used to heat the phase change layer 120 to write data therein. Thus the first circuit is the write circuit. The second row electrode lead 144, the carbon nanotube layer 110, the phase change layer 120 and the second column electrode lead 148 are electrically connected in series to form the second circuit. The second circuit is used to detect the resistance of the phase change layer 120 to get the data. Thus the second circuit is the read circuit.

When applying a voltage between the first row electrode lead 142 and the first column electrode lead 146, the current flows through the first row electrode lead 142, the carbon nanotube layer 120 and the first column electrode lead 146. The data can be written into the phase change memory cell 20. When applying a voltage between the second row electrode lead 144 and the second column electrode lead 148, the current flows though the second row electrode lead 144, the carbon nanotube layer 110 and the phase change layer 120 and the second column electrode lead 148. The data can be read out from the phase change memory cell 20.

The distance between the first row electrode lead 142 and the second row electrode lead 144 can range from about 50 nm to about 2 centimeters. The width of the first row electrode lead 142 and the second row electrode lead 144 can range from about 30 nm to about 100 μm respectively. The thickness of the first row electrode lead 142 and the second row electrode lead 144 can range from about 10 nm to about 100 nm respectively. The material of the first row electrode lead 142 and the second row electrode lead 144 can be made of conductive material such as metal and ITO. In one embodiment, the material of the first row electrode lead 142 and the second row electrode lead 144 is made of conductive pastes and made by screen printing.

The first column electrode lead 146 and the second column electrode lead 148 are parallel with each other. The first column electrode lead 146 intersects with and is insulated from the first row electrode lead 142 by an insulating layer 101. The insulating layer 101 is located between the first column electrode lead 146 and the first row electrode lead 142 in the intersection of them. The material of the insulating layer 101 can be $SiO_2$, $Si_3N_4$ or $Ta_2O_5$. The thickness of the insulating layer 101 ranges from about 50 nm to about 200 μm and can be selected according to need. An angle between the extending direction of the first column electrode lead 146 with the first row electrode lead 142 and the second row electrode lead 144 ranges from about 10 degrees to about 90 degrees. In one embodiment, the first column electrode lead 146 is perpendicular with the first row electrode lead 142 and the second row electrode lead 144.

The second column electrode lead 148 intersects and is perpendicular with the first row electrode lead 142 and the second row electrode lead 144. The insulating layer 101 is located between the second column electrode lead 148 and the first row electrode lead 142 and the second row electrode lead 144. The carbon nanotube layer 110 and the phase change layer 120 are stacked on the intersection of the second column electrode lead 148 and the second row electrode lead 144.

The carbon nanotube layer 110 is located on the intersection of the second row electrode lead 144 and the second column electrode lead 148 and partly covers and electrically connects with the second row electrode lead 144. Furthermore, an insulating layer (not shown) may be located between the carbon nanotube layer 110 and the second row electrode lead 144. The insulating layer is used to reduce the contact surface between the carbon nanotube layer 110 and the second row electrode lead 144. Therefore most of the current will flow through the carbon nanotubes. The shape of the carbon nanotube layer 110 can be triangle, square, rectangular, round, oval or other shape. The size of the carbon nanotube layer 110 is arbitrary. In one embodiment, the carbon nanotube layer 110 is square. The length of the carbon nanotube layer 110 ranges from about 50 nm to about 900 nm. The width of the carbon nanotube layer 110 ranges from about 20 nm to about 600 nm. In one embodiment, the length is about 70 µm and the width is about 80 µm. The thickness of the carbon nanotube layer 110 ranges from about 0.5 nm to about 100 nm such as 20 nm, 5 µm and 10 µm. In one embodiment, the carbon nanotube layer 110 is directly applied on the substrate 100. The carbon nanotube layer 110 can be etched via lithography, etching, laser or plasma etching electronic to partly reserve the carbon nanotube layer which is necessary. Thus the carbon nanotube layer 110 will form a pattern on the substrate 100.

The phase change layer 120 is stacked with the carbon nanotube layer 110. In one embodiment, the entire surface of the phase change layer 120 is in contact with the surface of the carbon nanotube layer 110. Furthermore, a heat conductive layer (not shown) can be located between the phase change layer 120 and the carbon nanotube layer 110. The heat conductive layer is used to conduct the heat from the carbon nanotube layer 110 to the phase change layer 120.

Furthermore, the phase change layer 120 and the carbon nanotube layer 110 are surrounded and covered by a thermal insulation material (not shown). The thermal insulation material can be located on the phase change layer 120 and the carbon nanotube layer 110 via coating or screen printing. The thermal insulation material covers part surface of the carbon nanotube layer 110 and phase change layer 120 which is exposed on the substrate 100. The thermal insulation material is used to reduce the heat loss, the time to reach the phase transition temperature of the phase change layer 120 will be reduced. Thus the response speed of the phase change memory cell 20 will be improved.

The first electrode 132 is a bar-shape electrode and extends from the first row electrode lead 142 to the second row electrode lead 144. The extending direction of the first electrode 132 is perpendicular with that of the first row electrode lead 142. The first electrode 132 includes two opposite ends. The first end is electrically connected with the first row electrode lead 142, and the second end is electrically connected with the carbon nanotube layer 110. The first electrode 132 is spaced from the second column electrode lead 148. Furthermore, the first electrode 132 is insulated from the second row electrode lead 144 with the insulating layer 101. It is can be understood that the first electrode 132 can be omitted, and the first row electrode lead 142 can be directly connected with the carbon nanotube layer 110.

The second electrode 134 is a bar-shape electrode and extending from the first column electrode lead 146 to the second column electrode lead 148. The extending direction of the second electrode 134 is perpendicular with the first column electrode lead 146. The second electrode 134 includes two opposite ends. The first end is electrically connected with the first column electrode lead 146, and the second end is connected to the carbon nanotube layer 110. The second electrode 134 is not directly in contact with the first electrode 132, thus the first electrode 132, the carbon nanotube layer 110 and the second electrode 134 are electrically connected in series to form a working circuit. The first column electrode lead 146, the carbon nanotube layer 110 and the first row electrode lead 142 are electrically connected in series via this working circuit to form the first circuit. The first circuit is used to write data in the phase change memory cell 20. It is can be understood that the second electrode 134 is a selective element, and the first column electrode lead 146 can be directly connected with the carbon nanotube layer 110.

During the working process of the phase change memory cell 20, The first row electrode lead 142 is functioned as the first writing electrode, the second row electrode lead 144 is used as the first reading electrode, the first column electrode lead 146 is used as the second writing electrode and the second column electrode lead 148 is used as the second reading electrode.

When writing data into the phase change memory cell 20, a voltage or a signal is applied between the first writing electrode and the second writing electrode. Thus a current is introduced into the first circuit. The carbon nanotube layer 110 begins to produce heat to heat the phase change layer 120 in original phase state.

When reading data from the phase change memory cell 20, a voltage is applied between the first reading electrode and the second reading electrode, a current is introduced into the second circuit. The current is a relatively small therefore cannot cause the phase transition. By measuring the current flowing in the second circuit, the resistance of the phase change layer 120 can be calculated out. The phase state of the phase change layer 120 can be obtained by compared this resistance with that of the original state of the phase change layer 120. Thus the data is obtained.

Figure 6:
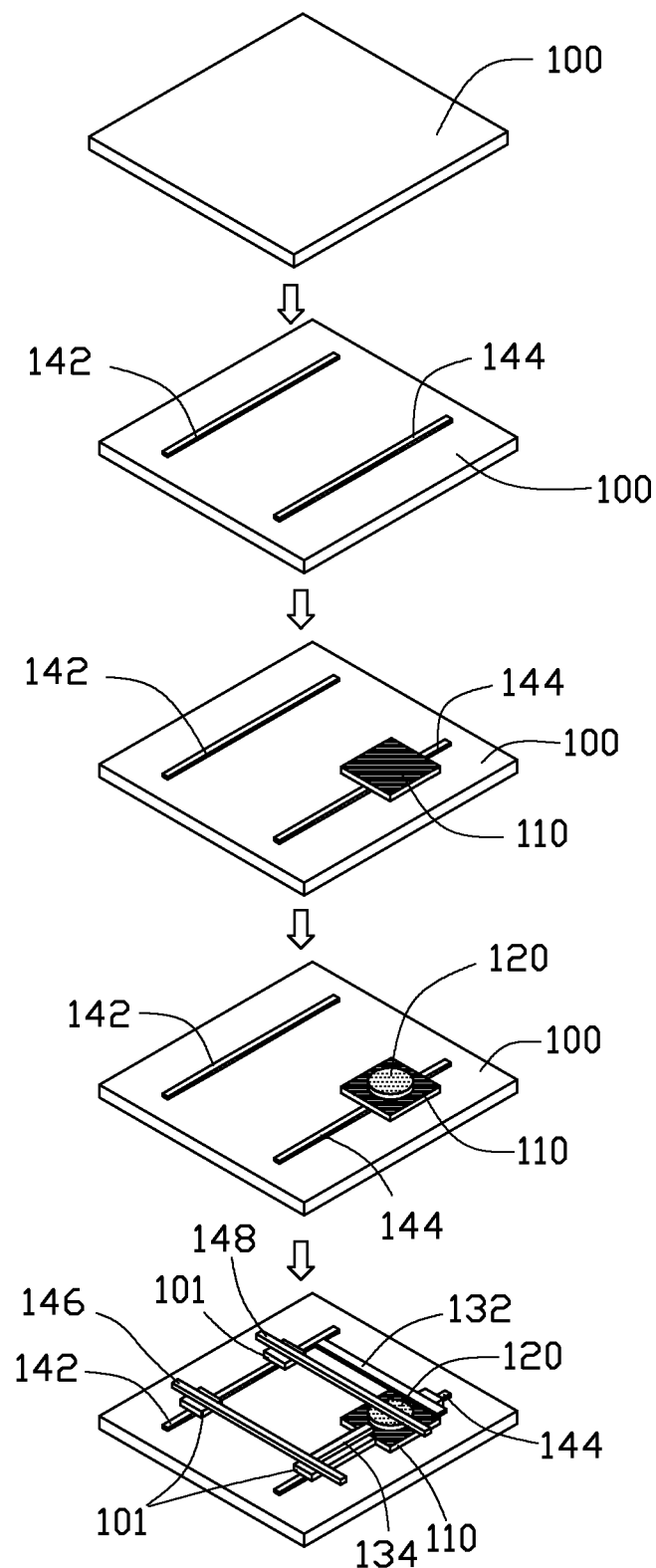
FIG. 6 shows a flowchart of one embodiment of a method for making a phase change memory cell of FIG. 4.

Referring to FIG. 6, a method for making the phase change memory cell 20 includes following steps:

(S21) providing a substrate 100;

(S22) applying a first row electrode lead 142 and a second row electrode lead 144 on a surface of the substrate 100;

(S23) locating a carbon nanotube layer 110 on the substrate, wherein the carbon nanotube layer 110 contacts the second row electrode lead 144;

(S24) attaching a phase change layer 120 on a surface of the carbon nanotube layer 110;

(S25) locating a first column electrode lead 146, a second column electrode lead 148, a first electrode 132 and a second electrode 134 on the substrate 100, wherein the first electrode 132 is electrically connected with the first row electrode lead 142 and the carbon nanotube layer 110, the second electrode 134 is electrically connected with the first column electrode lead 146 and the carbon nanotube layer 110, and the second column electrode lead 148 is in contact with the phase change layer 120.

In step (S21), the substrate 100 is an insulated substrate. In one embodiment, the substrate 100 is a flexible substrate.

In step (S22), the first row electrode lead 142 and the second row electrode lead 144 can be fabricated via screen printing, ion beam deposition, electron beam deposition and coating. The first row electrode lead 142 and the second row electrode lead 144 are parallel with and spaced from each other.

In step (S23), the carbon nanotube layer 110 is a continuous and free-standing structure. The carbon nanotube layer 110 can be formed by directly applying a carbon nanotube film on the substrate 100. The carbon nanotube film is drawn from a carbon nanotube array. The carbon nanotube layer 110 partly covers the second row electrode lead 144 and electrically connects with it.

In step (S25), the method of making the first column electrode lead 146, the second column electrode lead 148, the first electrode 132 and the second electrode 134 is same as that of the first row electrode lead 142. The first column electrode lead 146 is spaced from the first row electrode lead 142 and the second row electrode lead 144 via an insulating layer 101. The insulating layer 101 is applied on the intersection between the first column electrode lead 146 and the first row electrode lead 142. The insulating layer 101 is also located between the first column electrode lead 146 and the second row electrode lead 144.

Figure 7:
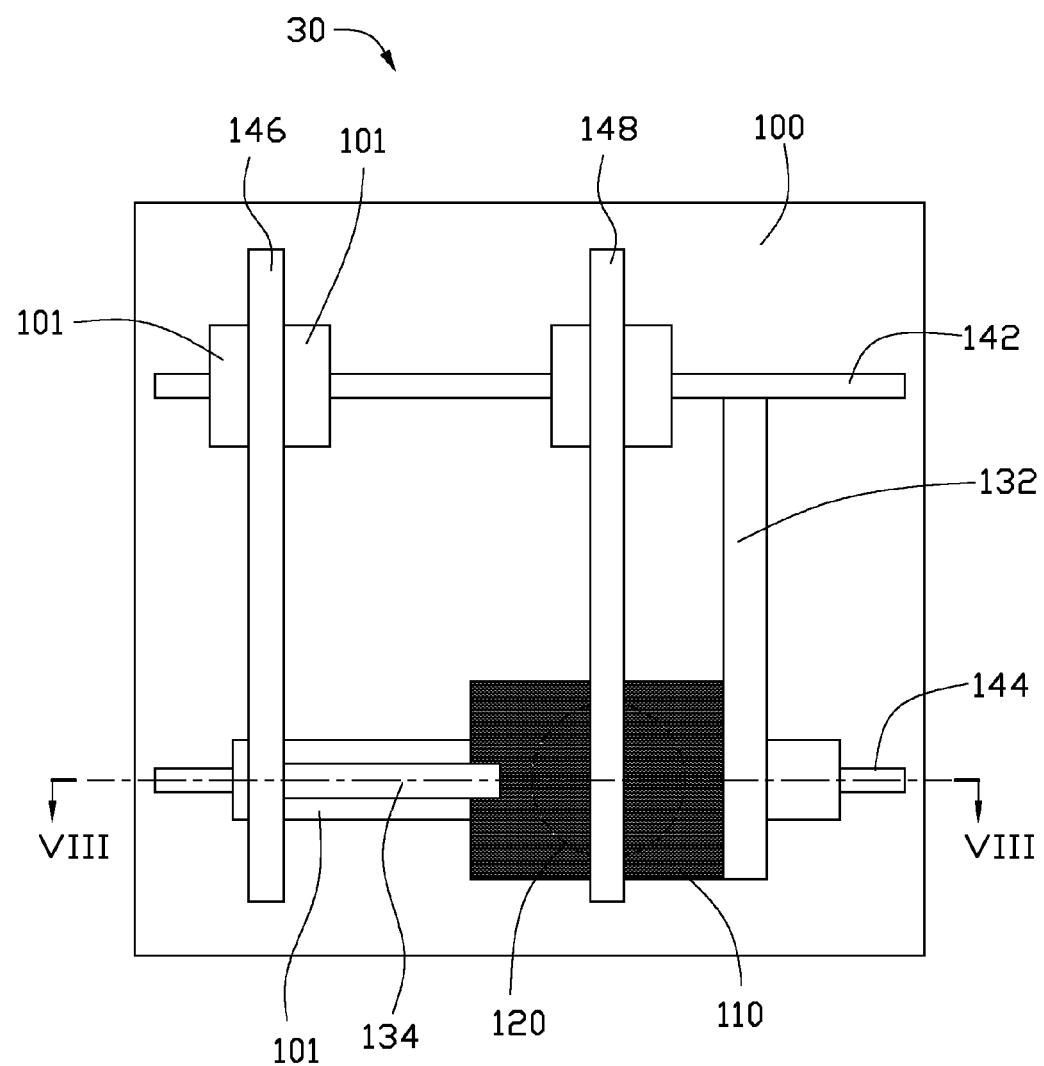
FIG. 7 shows a schematic top view of one embodiment of a phase change memory cell.
Figure 8:
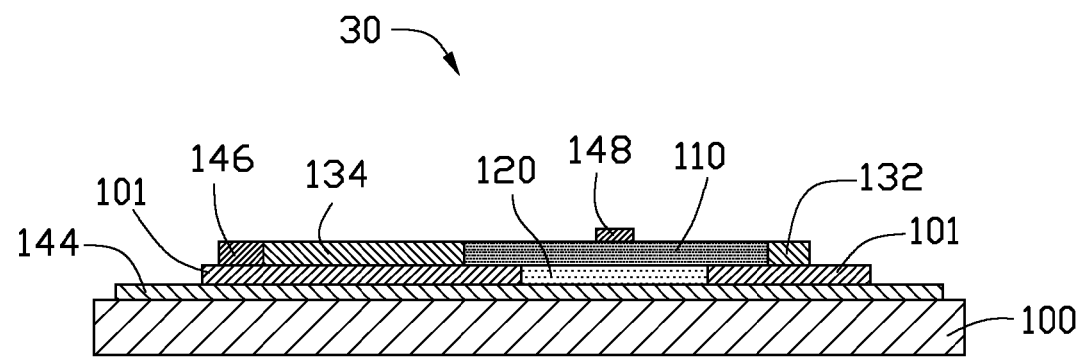
FIG. 8 shows a cross-sectional view along a line of VIII-VIII of FIG. 7.

Referring to FIG. 7 and FIG. 8, a phase change memory cell 30 includes a substrate 100, a carbon nanotube layer 110, a phase change layer 120, a first electrode 132, a second electrode 134, a first row electrode lead 142, a second row electrode lead 144, a first column electrode lead 146 and a second column electrode lead 148. The structure of the phase change memory cell 30 is similar to that of the phase change memory cell 20. The difference is that in the phase change memory cell 30, the phase change layer 120 is located on the substrate 100 and in contact with the second row electrode lead 144, and the carbon nanotube layer 110 is located on the phase change layer 120 and electrically connected with the second column electrode lead 148.

The phase change layer 120 is located on the substrate 100 and partly covers the second row electrode lead 144. The carbon nanotube layer 110 is located on the intersection of the second row electrode lead 144 and the second column electrode lead 148 and located between them. Furthermore, the carbon nanotube layer 110 is electrically connected with the second column electrode lead 148. The first row electrode lead 142, the first electrode 132, the carbon nanotube layer 110, the second electrode 134 and the first column electrode lead 146 are electrically connected in series to form the first circuit. The second column electrode lead 148, the carbon nanotube layer 110, the phase change layer 120, and the second row electrode lead 144 are electrically connected in series to form the second circuit. The area of the carbon nanotube layer 110 is greater than that of the phase change layer 120, and the entire surface of the phase change layer 120 is absolutely covered by the carbon nanotube layer 110.

A method for making a phase change memory cell 30 includes following steps:

(S31) providing a substrate 100;

(S32) locating a first row electrode lead 142 and a second row electrode lead 144 on a surface of the substrate 100;

(S33) applying a phase change layer 120 and connecting the phase change layer 120 with the second row electrode lead 144;

(S34) attaching a carbon nanotube layer 110 on the surface of the phase change layer 120;

(S35) forming a first column electrode lead 146, a second column electrode lead 148, a first electrode 132 and a second electrode 134 on the substrate 100, wherein the first electrode 132 is electrically connected with the first row electrode lead 142 and the carbon nanotube layer 110, the second electrode 134 is electrically connected with the first column electrode lead 146 and the carbon nanotube layer 110, and the second column electrode lead 148 is in contact with the carbon nanotube layer 110.

The method of making the phase change memory cell 30 is similar to that of the phase change memory cell 20, except that the phase change layer 120 is firstly applied on the substrate and the carbon nanotube layer 110 covers the phase change layer 120.

Figure 9:
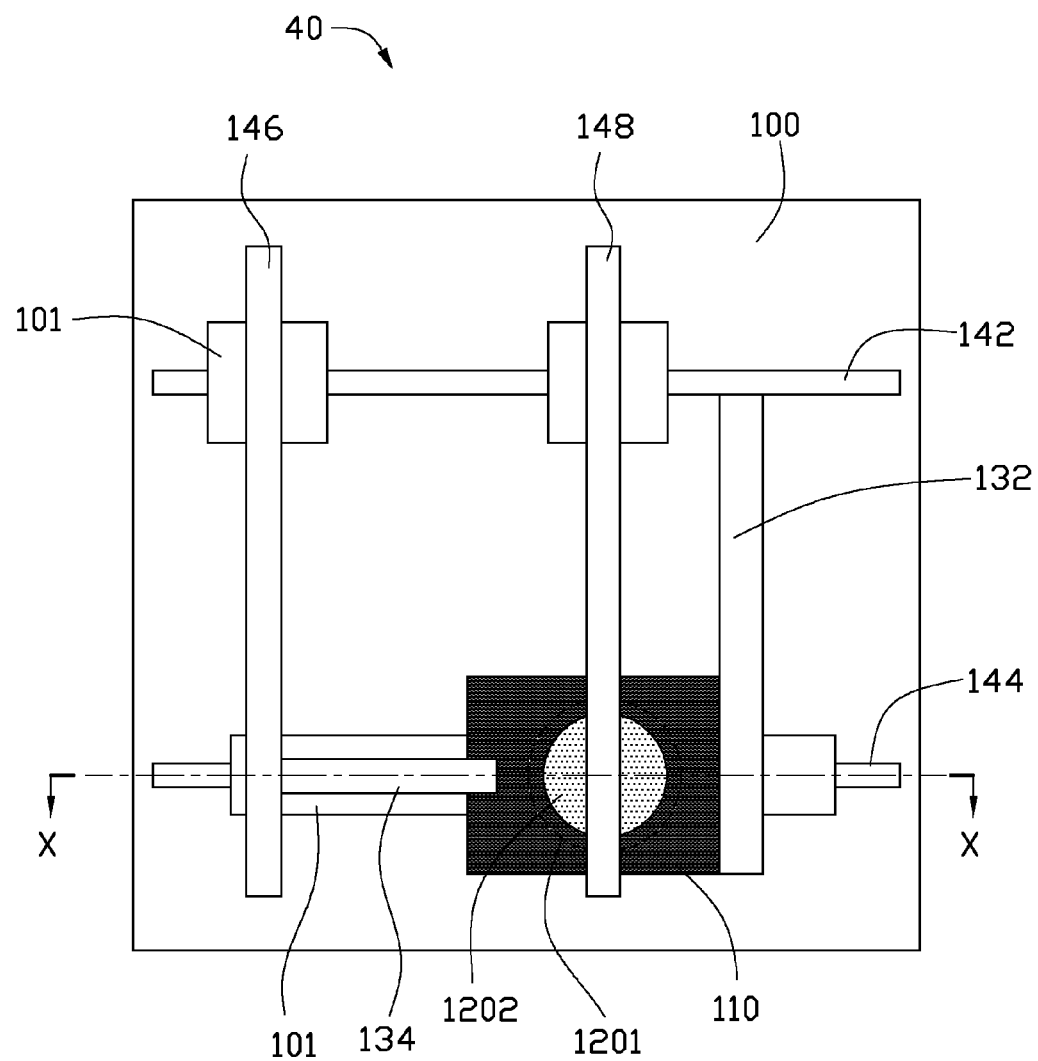
FIG. 9 shows a schematic view of one embodiment of a phase change memory cell including two layers of phase change layer.
Figure 10:
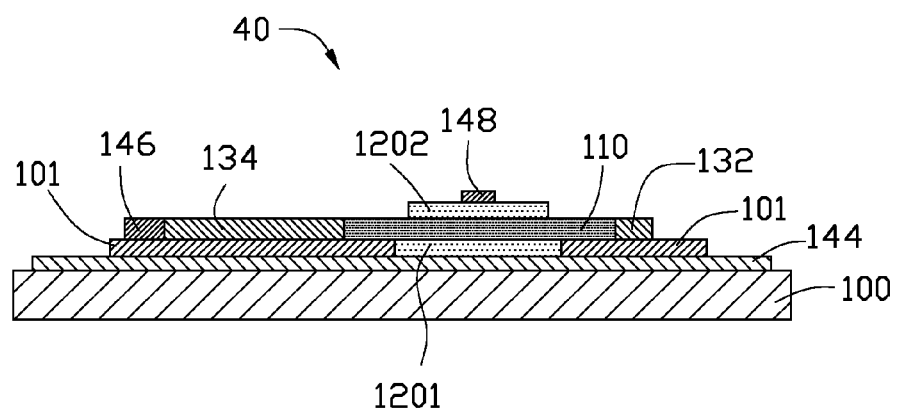
FIG. 10 shows a cross-sectional view along a line of X-X of FIG. 9.

Referring to FIG. 9 and FIG. 10, a phase change memory cell 40 includes a substrate 100, a carbon nanotube layer 110, a first phase change layer 1201, a second phase change layer 1202, a first electrode 132, a second electrode 134, a first row electrode lead 142, a second row electrode lead 144, a first column electrode lead 146 and a second column electrode lead 148. The structure of the phase change memory cell 40 is similar to that of the phase change memory cell 30. The difference is that in the phase change memory cell 40, a second phase change layer 1202 is located on the carbon nanotube layer 110 and electrically connected with the second column electrode lead 148, the carbon nanotube layer 110 is located between the first phase change layer 1201 and the second phase change layer 1202.

The first row electrode lead 142, the first electrode 132, the carbon nanotube layer 110, the second electrode 134 and the first column electrode lead 146 are electrically connected in series to form the first circuit. The second column electrode lead 148, the first phase change layer 1201, the carbon nanotube layer 110, the second phase change layer 1202, and the second row electrode lead 144 are electrically connected in series to form the second circuit.

While the phase change memory cell 40 is working, if one of the phase change layers cannot normally change the phase state, another phase change layer can still work normally. Thus the phase change memory cell 40 can still keep working. Thus the life span of the phase change memory cell 40 will be prolonged and the reliability will be improved.

A method for making a phase change memory cell 30 includes following steps:

(S41) providing a substrate 100;

(S42) locating a first row electrode lead 142 and a second row electrode lead 144 on a surface of the substrate;

(S43) applying a first phase change layer 1201 and connecting the first phase change layer 1201 with the second row electrode lead 144;

(S44) locating a carbon nanotube layer 110 on the surface of the first phase change layer 1201;

(S45) locating a second phase change layer 1202 on the carbon nanotube layer 110;

(S46) locating a first column electrode lead 146, a second column electrode lead 148, a first electrode 132 and a second electrode 134 on the substrate 100, wherein the first electrode 132 is electrically connected with the first row electrode lead 142 and the carbon nanotube layer 110, the second electrode 134 is electrically connected with the first column electrode lead 146 and the carbon nanotube layer 110, and the second column electrode lead 148 is in contact with the second phase change layer 1202.

The method of making the phase change memory cell 40 is similar to that of making the phase change memory cell 30. The difference is that a step of applying another phase change layer on the carbon nanotube layer before the step (S46).

Figure 11:
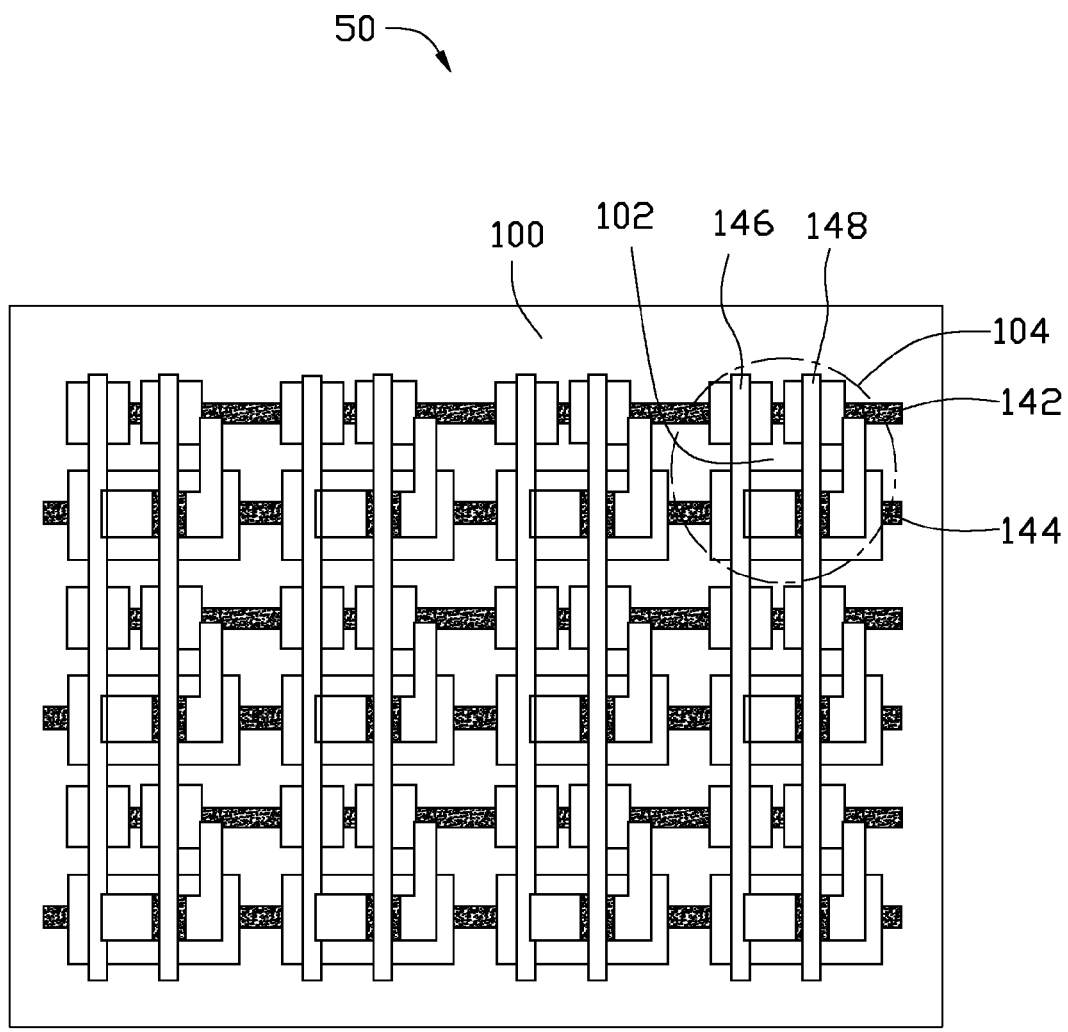
FIG. 11 shows a schematic top view of one embodiment of a phase change memory.

Referring to FIG. 11, a phase change memory 50 includes a substrate 100, a plurality of first row electrode leads 142, a plurality of second row electrode leads 144, a plurality of first column electrode leads 146, a plurality of second column electrode leads 148 and a plurality of phase change memory units 104 located on the substrate 100.

The plurality of first row electrode leads 142 is parallel and spaced with each other. The plurality of second row electrode leads 144 is parallel and spaced with each other. The first row electrode leads 142 and the second row electrode leads 144 are located alternately in the direction which is perpendicular to the extending direction. It means that, one first row electrode lead 142 is located between two adjacent second row electrode leads 144, and one second row electrode lead 144 is located between two adjacent first row electrode leads 142. Similarly, the first column electrode lead 146 and the second column electrode lead 148 are located alternately in the direction which is perpendicular to the extending direction. The first column electrode lead 146 is intersected and insulated with each of the first row electrode lead 142 and the second row electrode lead 144. The second column electrode lead 148 is also intersected and insulated with each of the first row electrode lead 142 and the second row electrode lead 144. A section 102 is defined between the adjacent first row electrode lead 142, the second row electrode lead 144, the first column electrode lead 146 and the second column electrode lead 148. The phase change memory unit 104 is received in one of sections 102.

Each phase change memory unit 104 includes a first electrode 132, a second electrode 134, a carbon nanotube layer 110 and a phase change layer 120.

Each section 102 and the phase change memory unit 104 forms a phase change memory cell. The structure of the phase change memory cell can be same as the phase change memory cell 20, 30, 40 mentioned above. In one embodiment, the plurality of the phase change memory units 104 is aligned in an array. The phase change memory units 104 in the same row are electrically connected with the same first row electrode lead 142 and the same second row electrode lead 144. The phase change memory units 104 in the same row are electrically connected with the same first column electrode lead 146 and the same second column electrode lead 144. Each of The phase change memory units 104 can be separately controlled. The phase change memory units 104 can be aligned in a relatively high density, thus it can be used for large-capacity data storage and reading.

Figure 12:
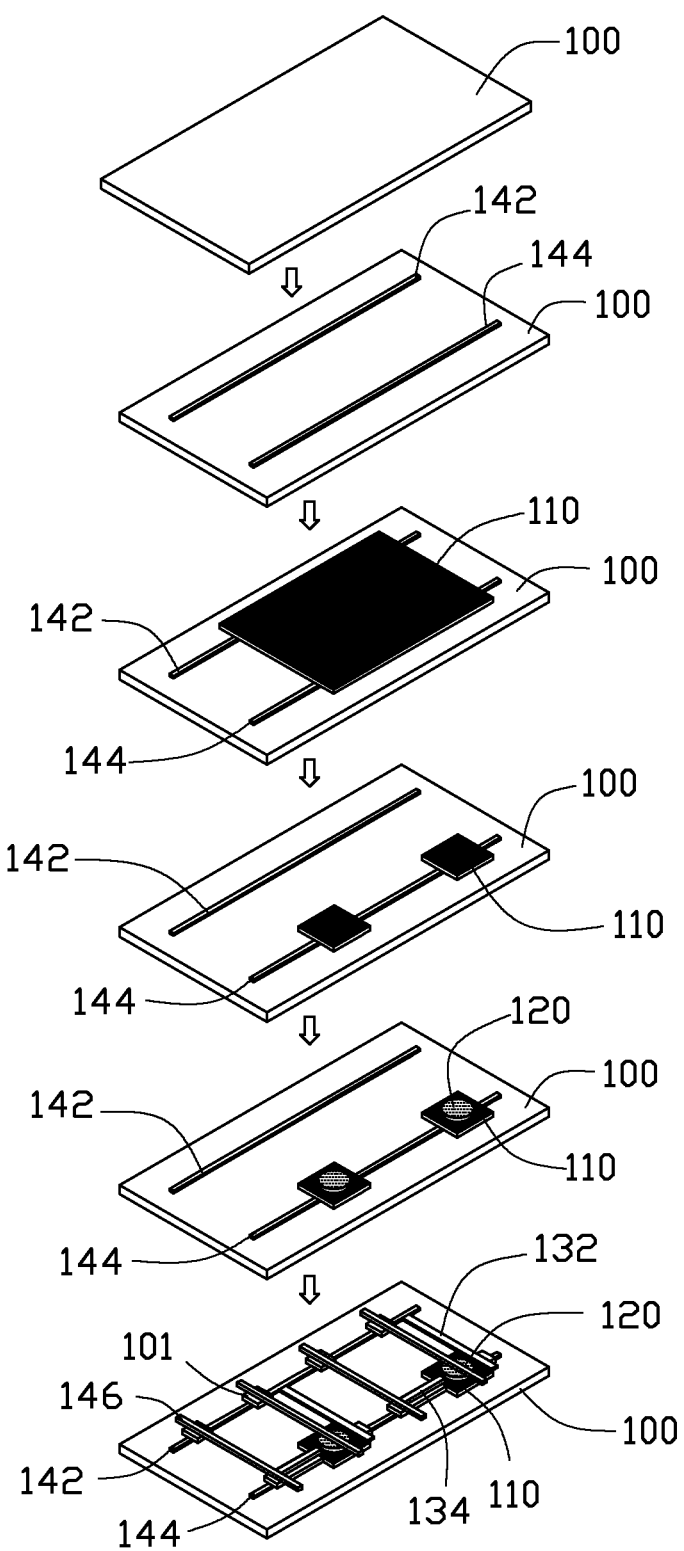
FIG. 12 shows a flow chart of one embodiment of a method for making a phase change memory of FIG. 11.

Referring to FIG. 12, a method for making the phase change memory 50 includes following steps:

(S51) providing a substrate 100;
(S52) alternatively locating a plurality of first row electrode lead 142 and second row electrode lead 144 on a surface of the substrate 100;
(S53) applying a carbon nanotube layer 110 on the substrate 100 to cover the first row electrode lead 142 and second row electrode lead 144;
(S54) patterning the carbon nanotube layer 110 to form a plurality of carbon nanotube units 1101;
(S55) attaching a phase change layer 120 on each of the carbon nanotube units 1101;
(S56) forming a first column electrode lead 146, a second column electrode lead 148, a first electrode 132 and a second electrode 134 on the substrate 100, the first electrode 132 is electrically connected with the first row electrode lead 142 and the carbon nanotube unit 1101, the second electrode 134 is electrically connected with the first column electrode lead 146 and the carbon nanotube unit 1101, and the second column electrode lead 148 is in contact with the carbon nanotube unit 1101.

In step (S52), the plurality of first row electrode leads 142 and the second row electrode leads 144 can be formed by following method: first, applying a plurality of electrode leads parallel with each other on the substrate 100; second, alternately defining the first row electrode lead 142 and the second row electrode lead 144 in the plurality electrode leads. It means that one electrode leads is defined as the first row electrode lead 142, and another adjacent electrode leads will be defined as the second row electrode lead 144 and so on.

In step (S53), the carbon nanotube layer 110 covers the entire surface of the substrate 100, and covers the first row electrode lead 142 and the second row electrode lead 144.

In step (S54), the carbon nanotube layer 110 can be etched via a method of lithography, etching or reactive ion etching (RIE). The carbon nanotube layer 110 can be partly reserved according to need. Thus the carbon nanotube layer 110 is divided into a plurality of carbon nanotube units 1101. The carbon nanotube units 1101 are spaced from each other and partly cover the surface of the second row electrode lead 144.

In one embodiment, the step of patterning the carbon nanotube layer 110 includes following substeps:

(S541) providing a laser device; and
(S542) irradiating the carbon nanotube layer 110 with the laser to remove part of the carbon nanotube layer 110 to form a plurality of the carbon nanotube units 1101.

In step (S541), the laser device can be an argon ion laser or a carbon dioxide laser. The laser device can emit a pulse laser beam. The power of the laser ranges from about 1 watt to about 100 watts. The power density of the laser irradiating on the carbon nanotube layer 110 is about $0.053 \times 10^{12}$ watt/m$^2$. In one embodiment, the power of the laser is about 12 watts. The laser beam is irradiated on the carbon nanotube layer 120, and a laser spot can be formed on the carbon nanotube layer 120. The shape of the laser spot is substantially round with a diameter ranging from about 1 μm to about 5 millimeters.

In step (S542), while the carbon nanotube layer 110 is irradiated by the laser, a plurality of carbon nanotubes on the irradiated position will be burn down, and other carbon nanotubes will be reserved. Then a plurality of carbon nanotube layer unit 1101 will be formed into a patterned carbon nanotube layer 110. During the process of irradiating the carbon nanotube layer 110, the energy of the laser is focus on the carbon nanotube layer 110. Other elements on the substrate are not affected by the laser. The incident angle of the laser is arbitrary. In one embodiment, the incident direction is perpendicular with the carbon nanotube layer 110.

Furthermore, the carbon nanotube layer 110 can also patterned via RIE to form a plurality of carbon nanotube layer unit 1101. The carbon nanotube layer 110 is etched by following steps:

providing a mask layer (not shown);
locating the mask layer on the carbon nanotube layer 110; and
etching the carbon nanotube layer via RIE to form a plurality of carbon nanotube unit 1101.

The etching gas can be selected according to need. The etching gas can corrupt the carbon nanotube layer 110. The mask layer should not be affected by the etching gas. In one embodiment, the etching gas is $CF_4$ and $SF_6$. The flow rate of the $CF_4$ ranges from about 10 sccm to about 50 sccm. The flow rate of the $SF_6$ ranges from about 2 sccm to about 20 sccm. During the etching process, the unwanted carbon nanotubes will be removed to form the plurality of the carbon nanotube unit 1101.

In the method of making the phase change memory 50, the carbon nanotube layer 110 is a free-standing structure, thus it can be directly disposed on the substrate. The carbon nanotube layer can be easily etched to form a plurality of phase change memory cell, thus it is convenient to fabricate the phase change memory with a relatively large area. Furthermore, the carbon nanotube layer is etched via the lithography or RIE to form the carbon nanotube unit, the precision and the size of the carbon nanotube unit can be precisely controlled. Thus a phase change memory cell with relatively small size can be formed, and the density and the integration of the phase change memory cell will be improved.

The phase change memory cell and the phase change memory can have following advantages. First, the carbon nanotube layer has relatively high conductivity and chemical stability, thus the life span of the phase change memory will be improved. Second, the carbon nanotube layer is functioned as the heating element, and the carbon nanotube layer is flexible, thus the phase change memory can be flexible too. Third, the carbon nanotube film is a free-standing structure with suitable conductivity, thus the current can be introduced into the carbon nanotube layer via applying a voltage on any two opposite sides of the carbon nanotube layer, and it is convenient to set the electrode. Fourth, because the carbon nanotube layer can be directly applied on the substrate and easily etched via lithography to form the heating element, the method is relatively simple, the integration is relatively high and the cost is relatively low.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. A phase change memory cell, comprising:
   a first row electrode lead and a second row electrode lead spaced from each other;
   a first column electrode lead and a second column electrode lead spaced from each other, wherein the first column electrode lead is intersected with and spaced from the first row electrode lead and the second row electrode lead, and the second column electrode lead is intersected with and spaced from the second row electrode lead to define an intersection;
   a carbon nanotube layer and a phase change layer stacked together and sandwiched between the second row electrode lead and the second column electrode lead at the intersection;
   a first electrode electrically connected to the first row electrode lead;
   a second electrode electrically connected to the first column electrode lead, wherein the second electrode is spaced from the first electrode, and the carbon nanotube layer is electrically connected to the first electrode and the second electrode.

2. The phase change memory cell of claim 1, wherein the first row electrode lead is parallel with the second row electrode lead, and the first column electrode lead is parallel with the second column electrode lead.

3. The phase change memory cell of claim 2, wherein the first row electrode lead is perpendicular with the first column electrode lead and the second column electrode lead.

4. The phase change memory cell of claim 1, wherein the phase change layer is in direct contact with and partly covers the second row electrode lead.

5. The phase change memory cell of claim 4, wherein the carbon nanotube layer is in contact with the second column electrode lead and covers the phase change layer.

6. The phase change memory cell of claim 1, wherein the first row electrode lead, the first electrode, the carbon nanotube layer, the second electrode and the first column electrode lead are electrically connected in series to form a first circuit, and the first circuit is adapted to write data into the phase change memory cell or reset the phase change memory cell.

7. The phase change memory cell of claim 1, wherein the second column electrode lead, the carbon nanotube layer, the phase change layer, and the second row electrode lead are electrically connected in series to form a second circuit, and the second circuit is adapted to read data from the phase change memory cell or reset the phase change memory cell.

8. The phase change memory cell of claim 1, wherein the carbon nanotube layer is a continuous layer-shaped structure and comprises a plurality of carbon nanotubes joined end to end by van der Waals force, and an extending direction of each of the plurality of carbon nanotubes is parallel with a surface of the carbon nanotube layer.

9. The phase change memory cell of claim 1, further comprising a substrate, wherein the phase change layer and the carbon nanotube layer are stacked together on a surface of the substrate.

10. The phase change memory cell of claim 9, wherein the carbon nanotube layer comprises a plurality of carbon nanotubes oriented parallel with the surface of the substrate.

11. The phase change memory cell of claim 9, wherein the substrate is flexible.

12. The phase change memory cell of claim 1, wherein the phase change layer is located within a coverage area of the carbon nanotube layer.

13. The phase change memory cell of claim 1, wherein the carbon nanotube layer comprises a drawn carbon nanotube film, the drawn carbon nanotube film comprises a plurality of carbon nanotubes are joined end to end by van der Waals force and are oriented along the same direction.

14. The phase change memory cell of claim 1, wherein the carbon nanotube layer comprises a plurality of drawn carbon nanotube films stacked together, and extending directions of the carbon nanotubes in adjacent drawn carbon nanotube films are substantially the same.

15. The phase change memory cell of claim 1, wherein the carbon nanotube layer comprises a plurality of drawn carbon nanotube films stacked together and extending directions of the carbon nanotubes in adjacent drawn carbon nanotube films intersected with each other.

16. The phase change memory cell of claim 1, wherein the carbon nanotube layer comprises a flocculated carbon nanotube film, and the flocculated carbon nanotube film comprises a plurality of carbon nanotubes entangled with each other.

17. The phase change memory cell of claim 1, wherein a thickness of the carbon nanotube layer ranges from about 0.5 nm to about 100 μm.

18. The phase change memory cell of claim 1, wherein a thickness of the phase change layer ranges from about 10 nm to about 150 nm.

19. A phase change memory cell, comprising:
   a first row electrode lead and a second row electrode lead parallel with each other;
   a first column electrode lead and a second column electrode lead parallel with each other, wherein the first column electrode lead is intersected with and spaced from the first row electrode lead and the second row electrode lead, and the second column electrode lead is intersected with and spaced from the second row electrode lead to define an intersection;

a first phase change layer, a carbon nanotube layer, and a second phase change layer stacked together and sandwiched between the second row electrode lead and the second column electrode lead at the intersection; wherein the first column electrode lead, the carbon nanotube layer, and the first row electrode lead are electrically connected in series to define a first circuit, and the first circuit is adapted to write data into the phase change memory cell or reset the phase change memory cell; the second row electrode lead, the first phase change layer, the carbon nanotube layer, the second phase change layer, and the second row electrode lead are electrically connected in series to define a second circuit, and the second circuit is adapted to read data into the phase change memory cell or reset the phase change memory cell.

20. A phase change memory cell, comprising:

a substrate;

a first row electrode lead and a second row electrode lead spaced from each other on a surface of the substrate;

a first column electrode lead and a second column electrode lead spaced from each other on the surface of the substrate, wherein the first column electrode lead is intersected with and spaced from the first row electrode lead and the second row electrode lead, and the second column electrode lead is intersected with and spaced from the second row electrode lead to define an intersection;

a phase change layer and a carbon nanotube layer overlapped with each other on the surface of the substrate, wherein the phase change layer and the carbon nanotube layer are sandwiched between the second row electrode lead and the second column electrode lead at the intersection, the phase change layer is in contact with the second row electrode lead, and the carbon nanotube layer is in contact with the second column electrode lead.

* * * * *